United States Patent
Doong

(10) Patent No.: US 6,740,592 B1
(45) Date of Patent: May 25, 2004

(54) SHALLOW TRENCH ISOLATION SCHEME FOR BORDER-LESS CONTACT PROCESS

(75) Inventor: Kelvin Yih Yuh Doong, Kaohsiung (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 123 days.

(21) Appl. No.: 09/999,455

(22) Filed: Dec. 3, 2001

(51) Int. Cl.[7] ............................................. H01L 4/311
(52) U.S. Cl. ...................................... 438/700; 438/706
(58) Field of Search ................................ 438/461, 424, 438/694, 700, 702, 717, 723, 724

(56) References Cited

U.S. PATENT DOCUMENTS

| | | | |
|---|---|---|---|
| 4,533,429 A | 8/1985 | Josquin | 156/643 |
| 4,845,048 A | 7/1989 | Tamaki et al. | 437/62 |
| 5,447,884 A | 9/1995 | Fahey et al. | 437/67 |
| 5,652,176 A | 7/1997 | Maniar et al. | 437/67 |
| 5,677,231 A * | 10/1997 | Maniar et al. | 438/221 |
| 5,960,318 A * | 9/1999 | Peschke et al. | 438/637 |
| 6,046,103 A | 4/2000 | Thei et al. | 438/624 |
| 6,121,064 A | 9/2000 | Lasky et al. | 438/16 |
| 6,232,223 B1 * | 5/2001 | Tran et al. | 438/637 |
| 6,235,606 B1 * | 5/2001 | Huang et al. | 438/400 |
| 6,258,712 B1 * | 7/2001 | Wang | 438/634 |
| 6,265,271 B1 | 7/2001 | Thei et al. | 438/296 |
| 6,265,302 B1 * | 7/2001 | Lim et al. | 438/622 |
| 6,287,962 B1 * | 9/2001 | Lin | 438/638 |
| 6,318,384 B1 * | 11/2001 | Khan et al. | 134/22.1 |
| 6,399,512 B1 * | 6/2002 | Blosse et al. | 438/723 |

OTHER PUBLICATIONS

Co-pending U.S. patent application Ser. # 09/398,293 (TSMC-98-633) to L. Lui, filed on Sep. 20, 1999.

* cited by examiner

Primary Examiner—Kin-Chan Chen
(74) Attorney, Agent, or Firm—George O. Saile; Stephen B. Ackerman; Rosemary L. S. Pike

(57) ABSTRACT

A method for avoiding current leakage at the shallow trench isolation edge in a border-less contact process is described. Trenches are etched into a semiconductor substrate. An etch stop liner layer is deposited within the trenches and etched back to leave the etch stop liner layer only on sidewalls of the trenches. The trenches are filled with an isolation layer overlying the liner sidewalls and polished back to leave the isolation layer only within the trenches. Semiconductor device structures, including source and drain junctions, are formed in the active areas. An interlevel dielectric layer is deposited over the device structures. Border-less contact openings are etched through the ILD wherein the liner sidewalls act as an etch stop thereby preventing leakage of the source and drain junctions. The contact openings are filled with a conducting layer wherein the liner sidewalls act as a diffusion barrier to the conducting layer.

28 Claims, 8 Drawing Sheets

SHALLOW TRENCH ISOLATION SCHEME FOR BORDER-LESS CONTACT PROCESS

BACKGROUND OF THE INVENTION (1) Field of the Invention

The present invention relates to the fabrication of integrated circuit devices, and more particularly, to a method of reducing junction leakage in a border-less contact processes in the fabrication of integrated circuits.

(2) Description of the Prior Art

In the fabrication of integrated circuit devices, shallow trench isolation (STI) is often used to isolate active areas from one another. In order to shrink cell size, border-less contact is one of the most important processes in the art. Of major concern is the border-less contact leakage current for shallow junctions, especially at the edge of the STI regions. It is desired to find a method of preventing leakage at the edge of STI regions in a border-less contact process.

Co-pending U.S. patent application Ser. No. 09/489,967 (TSMC-99-241) to K. B. Thei et al, filed on Jan. 24, 2000 discloses a method of depositing an etch stop layer over a salicide layer and densifying this layer. This etch stop layer prevents leakage at the STI edges during border-less contact formation. Co-pending U.S. patent application Ser. No. 09/398,293 (TSMC-98-633) to L. Lui, filed on Sep. 20, 1999, teaches forming an etch stop lining layer within via openings to protect the via sidewalls during etching of a trench opening in the formation of a dual damascene opening. U.S. Pat. No. 6,046,103 to Thei et al discloses an etch stop layer formed overlying a silicide layer. U.S. Pat. No. 5,652,176 to Maniar et al shows an aluminum nitride isolation trench liner that prevents junction leakage during border-less contact etching. U.S. Pat. No. 5,447,884 to Fahey et al teaches a nitride STI liner layer that is densified. U.S. Pat. No. 6,121,064 to Lasky et al shows a light-absorbing liner layer of hydrosilicon oxynitride. U.S. Pat. No. 4,533,429 to Josquin and 4,845,048 to Tamaki et al show silicon nitride liner layers on the sidewalls of a trench in a LOCOS process.

SUMMARY OF THE INVENTION

Accordingly, it is a primary object of the present invention to provide an effective and very manufacturable method for forming a border-less contact in the fabrication of integrated circuits.

It is a further object of the invention to provide a border-less contact process while avoiding current leakage at the shallow trench isolation edge in the fabrication of integrated circuits.

Yet another object is to provide a method for avoiding current leakage at the shallow trench isolation edge by forming an etch stop liner film on the sidewalls of the STI trench to protect the STI edge during borderless contact etching.

In accordance with the objects of the invention, a method for avoiding current leakage at the shallow trench isolation edge in a border-less contact process is achieved. Trenches are etched into a semiconductor substrate. An etch stop liner layer is deposited within the trenches and etched back to leave the etch stop liner layer only on sidewalls of the trenches to form liner sidewalls. The trenches are filled with an isolation layer overlying the liner sidewalls to complete formation of shallow trench isolation trenches separating active areas of the semiconductor substrate. Semiconductor device structures are formed in the active areas wherein the semiconductor device structures include source and drain junctions. An interlevel dielectric layer is deposited over the semiconductor device structures. Border-less contact openings are etched through the interlevel dielectric layer wherein the liner sidewalls act as an etch stop during this etching thereby preventing leakage of the source and drain junctions. The contact openings are filled with a conducting layer wherein the liner sidewalls act as a diffusion barrier to the conducting layer to form interconnects to complete fabrication of the integrated circuit device.

BRIEF DESCRIPTION OF THE DRAWINGS

In the accompanying drawings forming a material part of this description, there is shown.

DESCRIPTION OF THE PREFERRED EMBODIMENTS

The present invention proposes a new border-less contact etch stop liner formed on the sidewalls of the STI trench before trench filling. The etch stop liner serves as an etch stop during border-less contact etching and as a diffusion barrier for the contact metal layer. The etch stop liner layer protects the N+ or P+ junctions both vertically and horizontally, keeping junction leakage at an acceptable level.

Figure 1:
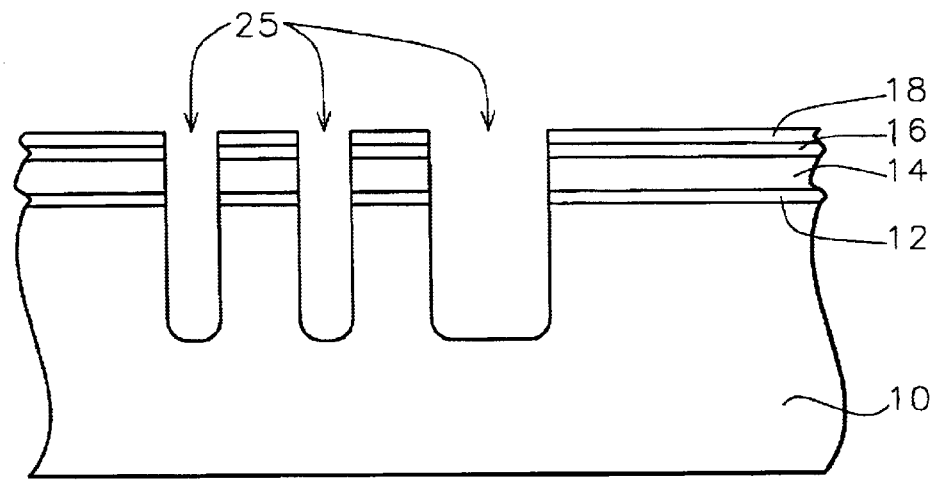
FIGS. 1 through 10 are cross-sectional representations of a preferred embodiment of the present invention.

Referring now more particularly to FIG. 1, there is shown a semiconductor substrate 10, preferably composed of monocrystalline silicon. Shallow trench isolation (STI) regions are now to be formed. For example, a stacked film hard mask structure is deposited. A pad oxide layer 12 may be grown on the surface of the semiconductor substrate to a thickness of between about 50 and 150 Angstroms. Then, a silicon nitride layer 14 may be deposited overlying the pad oxide layer to a thickness of between about 800 and 1500 Angstroms. Now, a second oxide layer 16 is deposited over the silicon nitride layer to a thickness of between about 100 and 500 Angstroms. The second oxide layer 16 is optional. Finally, a barrier and anti-reflective coating (BARC) layer 18 is coated over the second oxide layer to a thickness of between about 100 and 500 Angstroms. The BARC layer may comprise silicon oxynitride or an organic thin film. Now, the hard mask film stack is patterned to provide openings where shallow trench isolation regions are to be formed. Etching continues into the semiconductor substrate to form trenches 25, as shown in FIG. 1.

Figure 2:
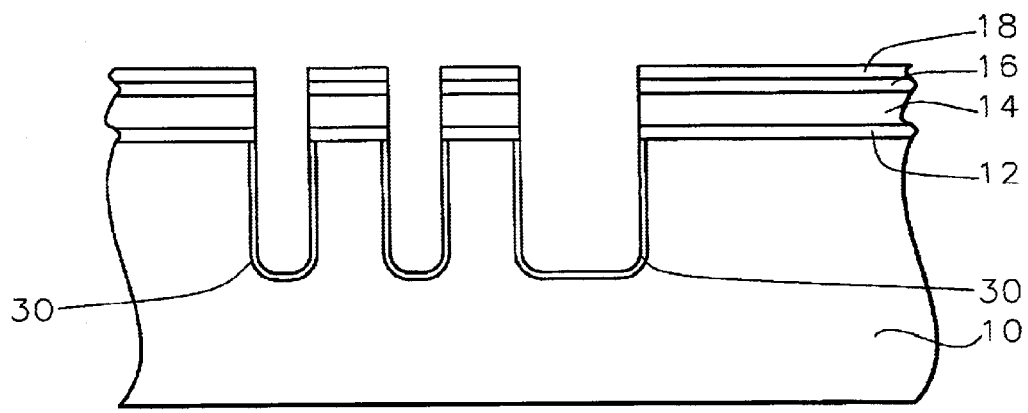

Now, thermal oxidation is performed to form the liner oxide layer 30 surrounding the isolation trenches 25, as shown in FIG. 2.

Figure 3:
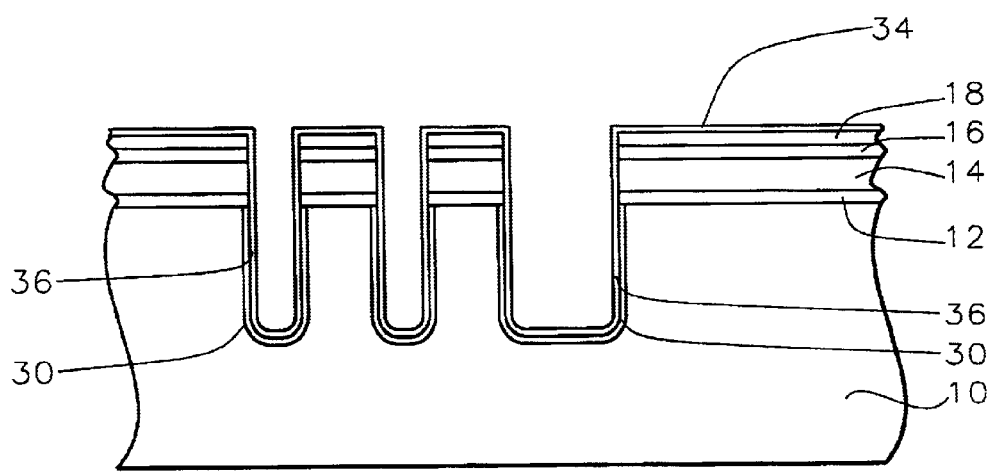

Referring now to FIG. 3, a key feature of the present invention will be described. An etch stop liner layer 34 is deposited conformally over the hard mask film stack and within the isolation trenches. The etch stop liner layer overlies the oxide liner layer 30 within the trenches. The etch stop liner layer may be silicon nitride deposited by low pressure chemical vapor deposition (LPCVD) or silicon oxynitride deposited by chemical vapor deposition or LPCVD. The etch stop liner layer 34 is deposited to a thickness of between about 50 and 300 Angstroms. Because the etch stop liner film is tensile-stressed, it is necessary for stress releasing to grow the oxide liner layer prior to the etch stop liner layer deposition.

Figure 4:
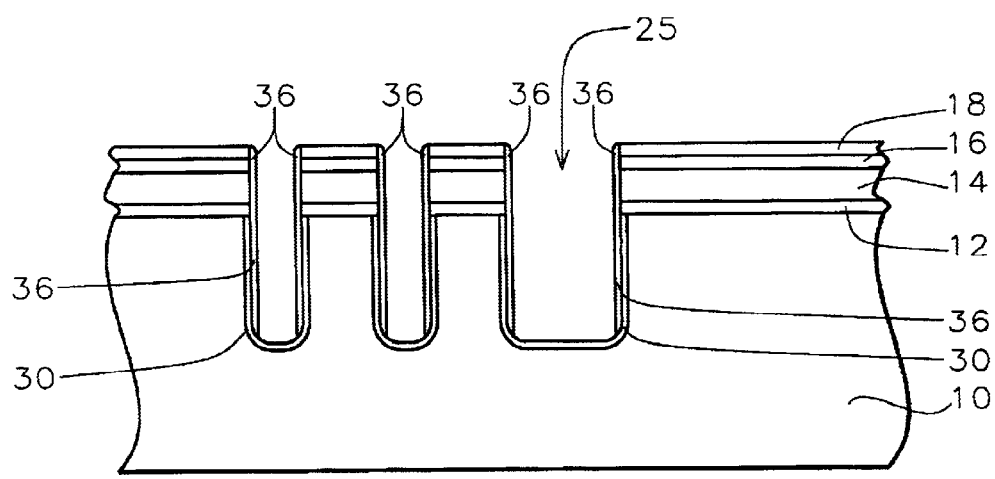

Referring now to FIG. 4, another key feature of the present invention will be described. The etch stop liner layer 34 is etched back to leave the etch stop liner layer only on the sidewalls of the trenches 25. It is necessary to perform this etching back process in order to prevent etch stop material residues when the hard mask film stack is stripped.

The etch back process is a dry etching having a selectivity of nitride or oxynitride to oxide of about 1:10 at the open areas and about 1:3–4 at the trench bottom. Thus, the etch process is controlled easily and etching stops at the liner oxide at the trench bottom and at the hard mask in the active area. The etch back process is self-aligned and mask-less, which means that process control is easy and stable. FIG. 4 illustrates sidewall etch stop liners 36.

Figure 5:
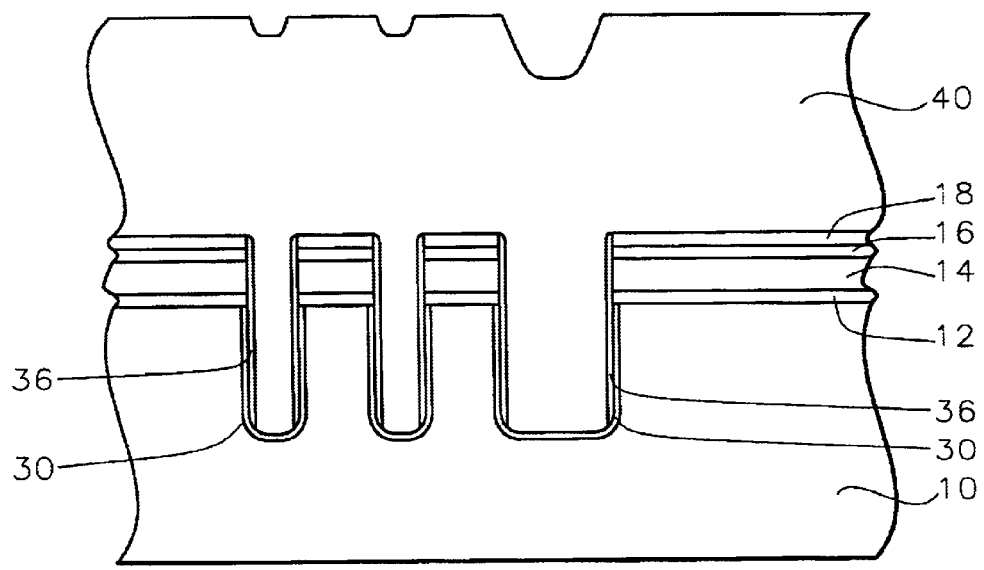
Figure 6:
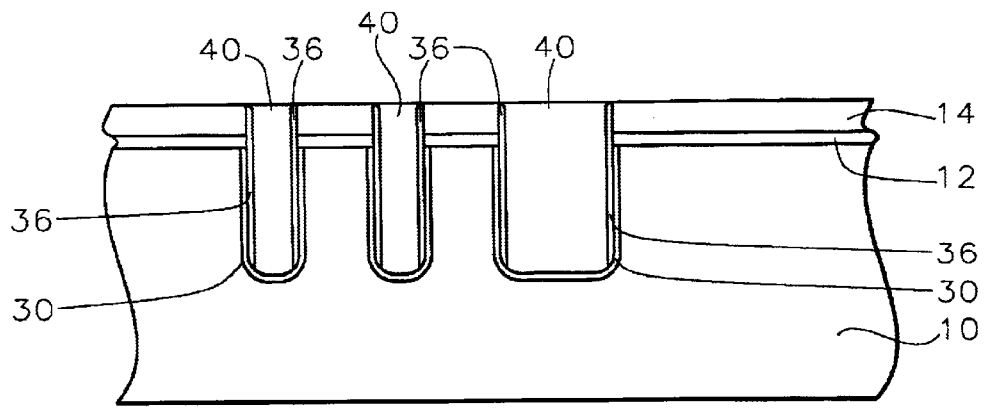
Figure 7:
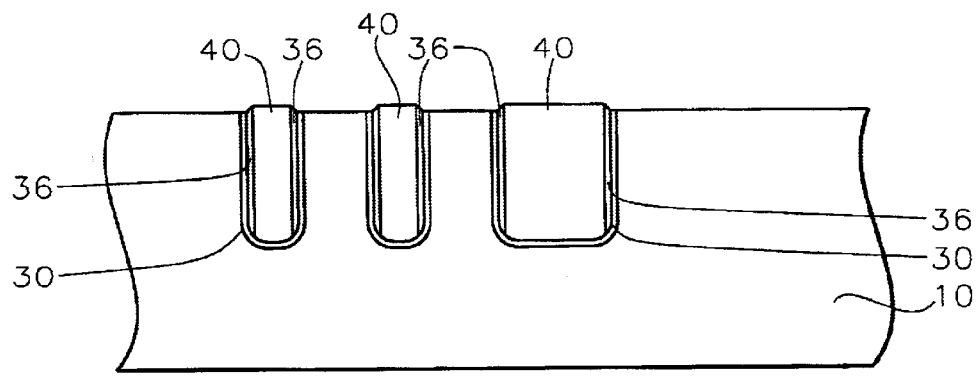

Now, the STI trenches are filled with a gap-filling oxide layer 40, as is conventional in the art, and as shown in FIG. 5. The oxide layer is polished back, for example by chemical mechanical polishing (CMP) with a polish stop at the silicon nitride layer 14. This completes the STI regions having an oxide liner layer 30, etch stop sidewalls 36, and oxide fill layer 40.

Now, the silicon nitride layer 14 is stripped, using, for example, hot phosphoric acid ($H_3PO_4$). The $H_3PO_4$ does not attack the etch stop sidewalls because of capillarity and cohesion of the $H_3PO_4$. As the thickness of the etch stop sidewalls increases, the phosphoric acid can attack the sidewalls and form divots in the sidewalls. However, a thickness of 50 to 300 Angstroms in the process of the present invention does not cause a problem. The pad oxide layer 12 is removed, for example, using a buffered oxide etch (BOE) or a diluted hydrofluoric (HF) acid solution.

Figure 8:
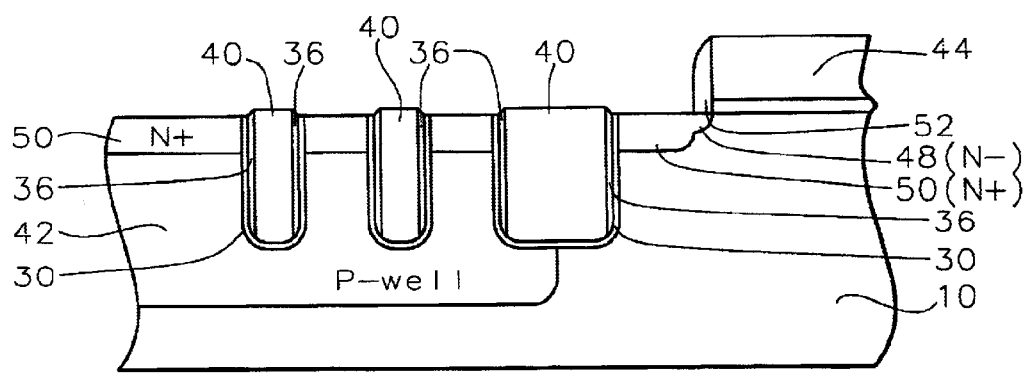

Now, semiconductor devices are formed, as is conventional in the art. For example, FIG. 8 shows P-well 42 formed in the substrate, polysilicon gate electrode 44 formed on the surface of the substrate, lightly doped source and drain regions 48, and heavily doped source and drain regions 50. It will be understood that the P-well could be an N-well and N+ or P+ regions could be formed.

Figure 9:
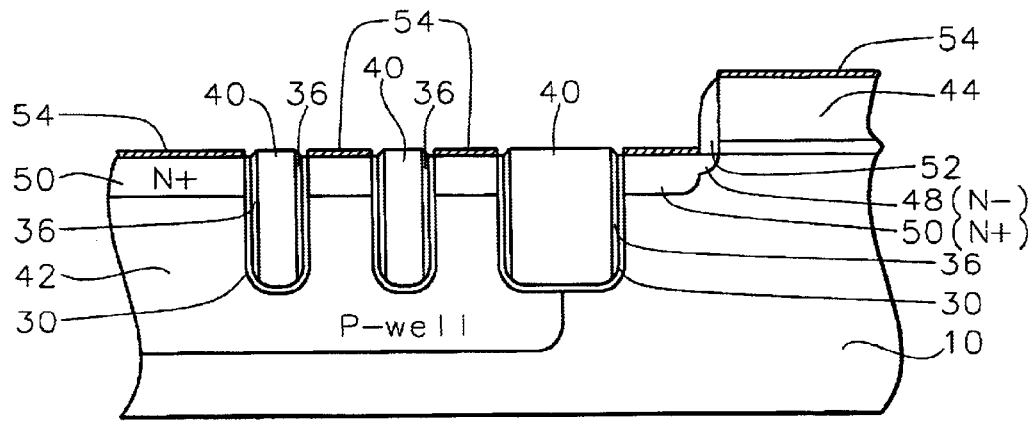

Now, the source and drain regions are to be salicided. The gate electrode could be salicided as well. For example, a layer of metal is sputter deposited over the surface of the substrate. This metal may be titanium, cobalt, nickel, tantalum, or the like. A rapid thermal annealing (RTA) step is performed. The metal layer overlying the source/drain regions 50 of the silicon substrate and overlying the polysilicon gate electrode 44 is transformed by the RTA to a silicide layer 54, for example titanium silicide (TiSi) or cobalt silicide (CoSi). The unreacted metal overlying the dielectric spacers 52 and the STI regions 40 is removed, as shown in FIG. 9.

Figure 10:
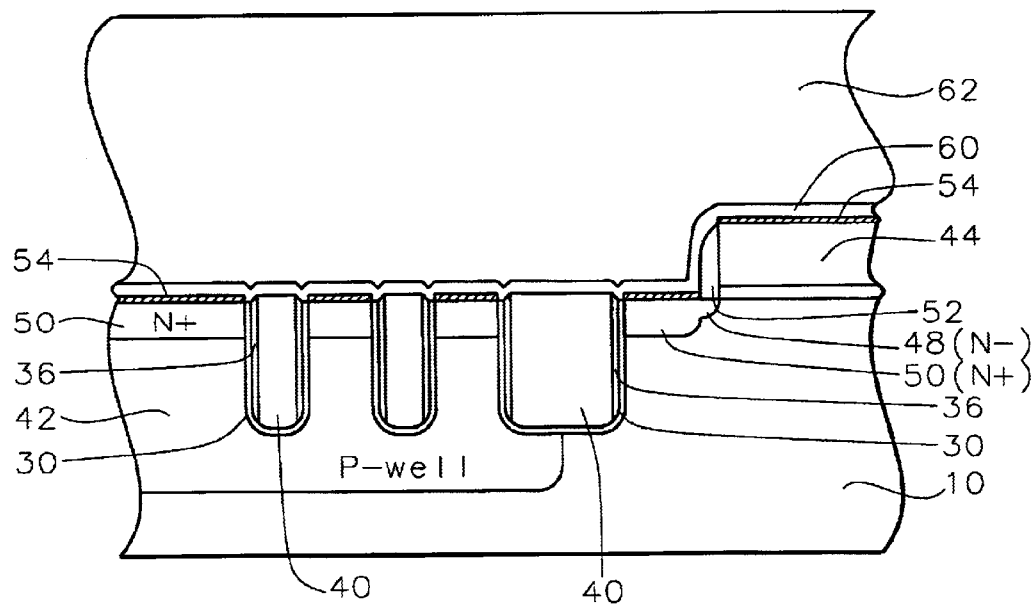

After salicidation, an interdielectric layer is deposited over the semiconductor device structures, as illustrated in FIG. 10. The dielectric layer may comprise a first conformal silicon nitride layer 60 having a thickness of between about 100 and 300 Angstroms and a thick layer of high density plasma phophosilicate glass 62, for example.

Figure 12:
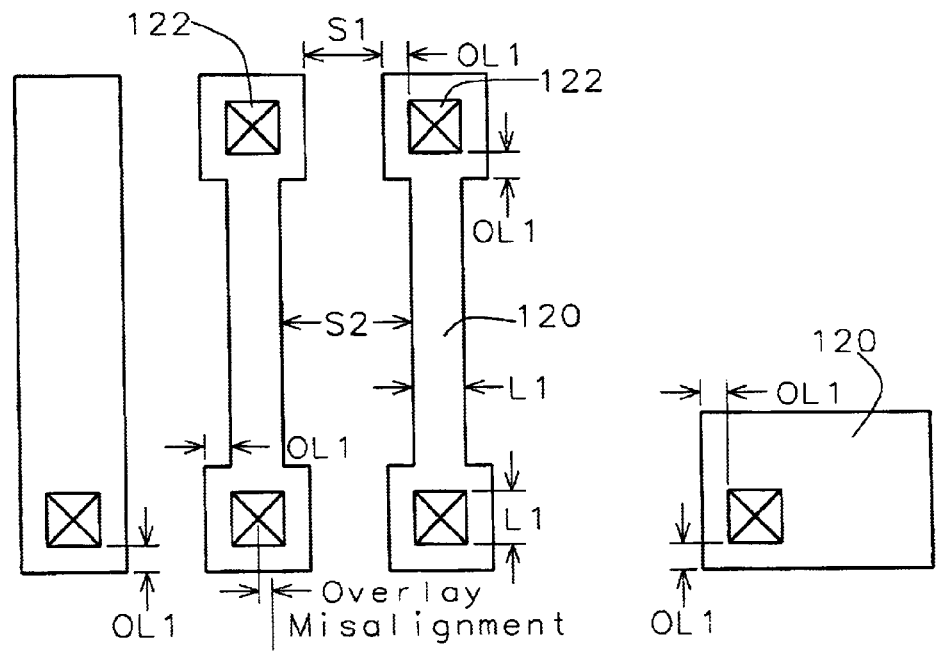
FIG. 12 is a top view of a non-local interconnect of the prior art.
Figure 13:
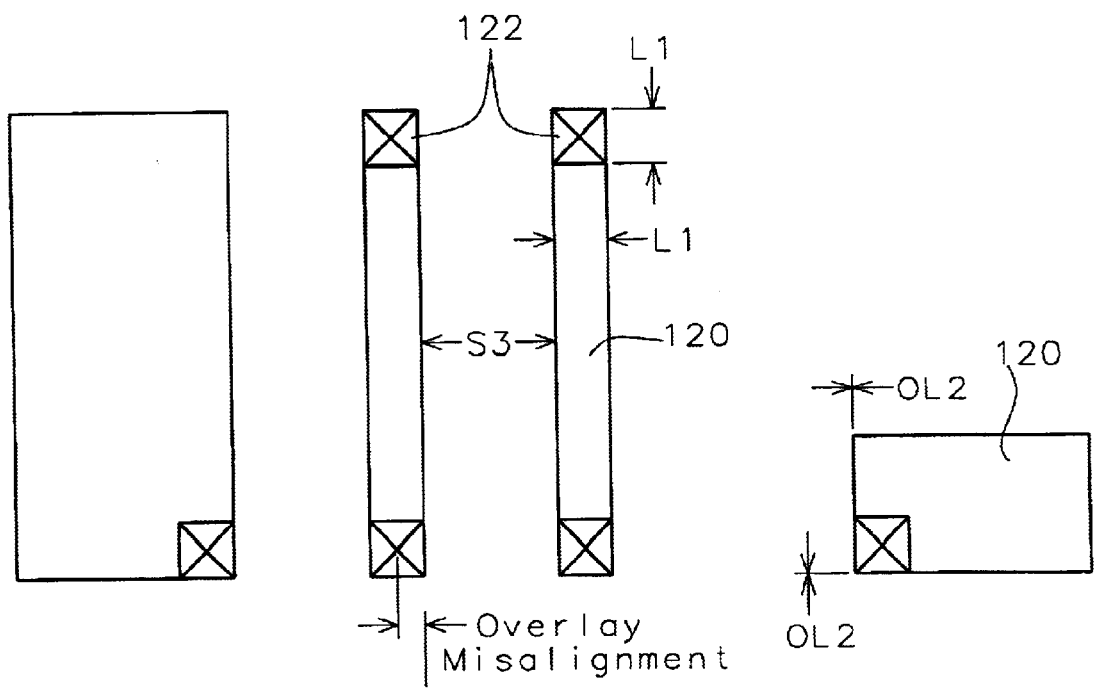
FIG. 13 is a top view of a non-local interconnect in a preferred embodiment of the present invention.

Now, border-less contacts are to be formed by the process of the present invention. FIG. 12 illustrates a top view of non-local interconnects of the prior art. Interconnection lines 120 and contacts 122 are shown. The spacing between contacts is S1 plus overlay misalignment compensation O1. FIG. 13 illustrates a top view of the non-local interconnect border-less contacts of the present invention. The spacing between contacts is S3, which can be scaled down to equal S1. Of concern in the border-less contact process is that the overlay misalignment may cause the contact to overlap the edge of the active area and so to extend into the STI region causing oxide loss from the top corner of the STI. No overlay misalignment compensation is required in the border-less contact process of the present invention because the etch stop liner 36 can prevent overetching of the STI caused by misalignment.

Figure 11:
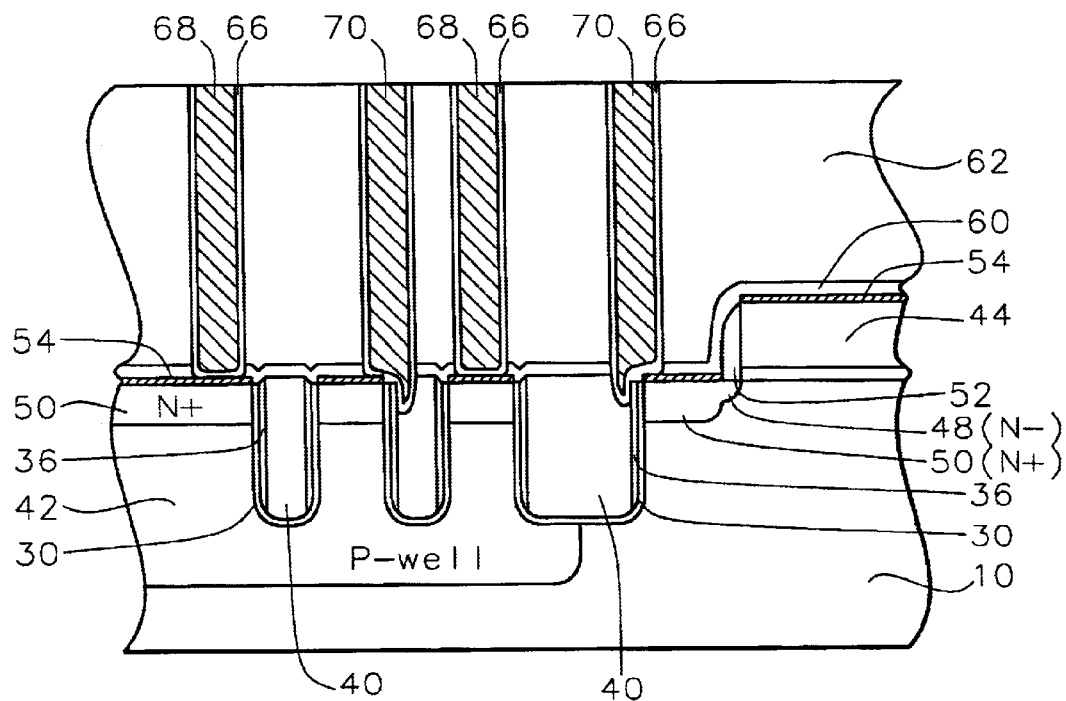
FIG. 11 is a cross-sectional representation of a non-local interconnect in a preferred embodiment of the present invention.

FIG. 11 illustrates the border-less non-local interconnection contacts of the present invention. Contacts 70 show overlay misalignment. The etch stop liner sidewalls 36 of the present invention prevent junction leakage in this situation. Without the etch stop liner sidewalls, junction leakage would result from the oxide loss at the top corner of the STI. Furthermore, the contact liner layer 66, typically titanium/titanium nitride, may react with the salicide layer 54. The etch stop liner 36 acts as a diffusion barrier to the contact liner layer 66.

The etch stop liner sidewalls of the present invention prevent junction leakage. In forming the contact openings, the dielectric layer 62 is etched away where it is not covered by a mask, not shown, to form contact openings with an etch stop at the conformal silicon nitride layer 60. This etching step has a etching selectivity of nitride to oxide of about 1:10. In a second step, the silicon nitride layer 60 within the contact openings is etched away using an etching selectivity of nitride to oxide of about 1:1. The liner layer 36 is not attacked significantly by this etch.

Processing now continues as is conventional in the art to complete the contacts. For example, a diffusion barrier layer, such as titanium/titanium nitride 66 is deposited conformally within the contact openings. Then the contact openings are filled with, for example, CVD tungsten, to form tungsten plugs 68 and 70. Further metallization may be performed. While non-mis-alignment (as in 68) is preferred, misalignment of the contact to the active area edge (as in 70) is allowed. Because of the etch stop liner sidewalls of the present invention, junction leakage will not occur even in the case of mis-alignment.

Figure 14:
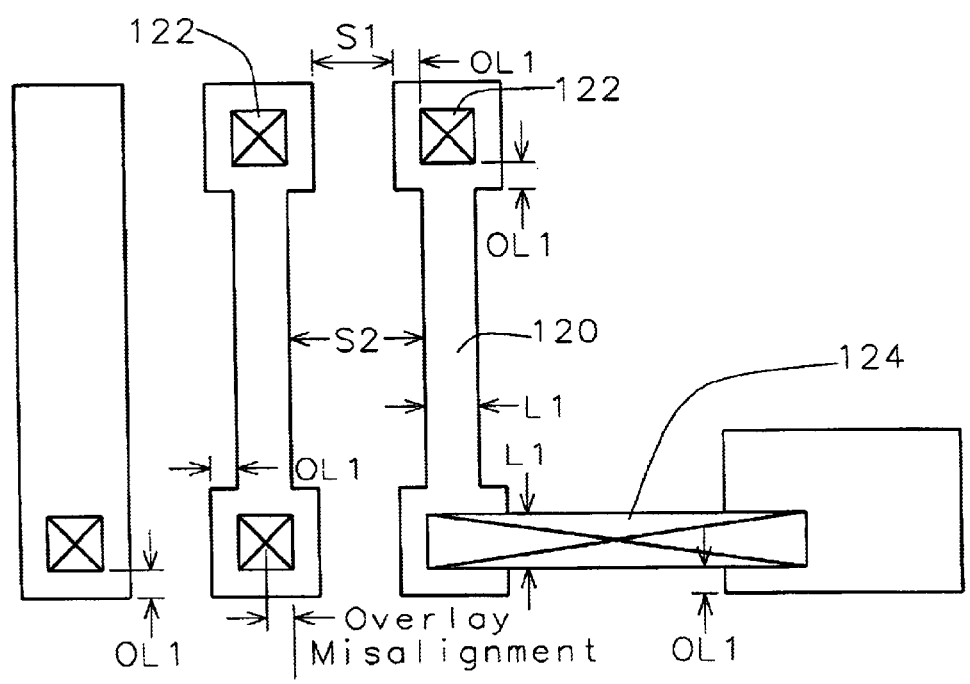
FIG. 14 is a top view of a local interconnect of the prior art.
Figure 15:
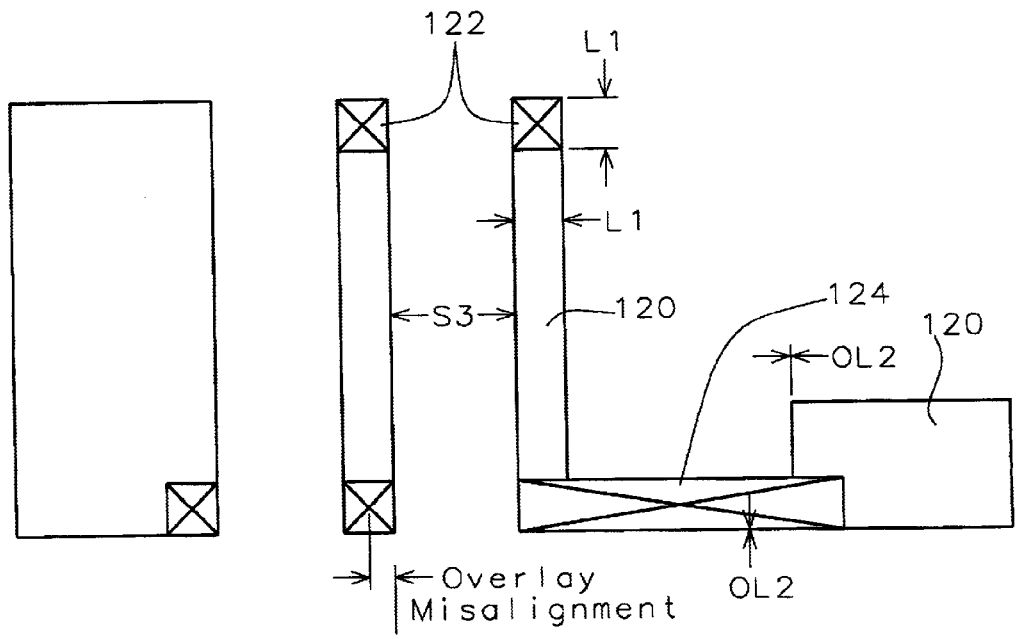
FIG. 15 is a top view of a local interconnect in a preferred embodiment of the present invention.

FIG. 14 illustrates a top view of local interconnects of the prior art. Interconnection lines 120, local interconnect 124, and contacts 122 are shown. FIG. 15 illustrates the border-less local interconnection contacts of the present invention. The etching process of the local interconnect 124 will be performed over the STI. To control the etching depth at the top corner of the STI is the key parameter for reducing junction leakage.

Figure 16:
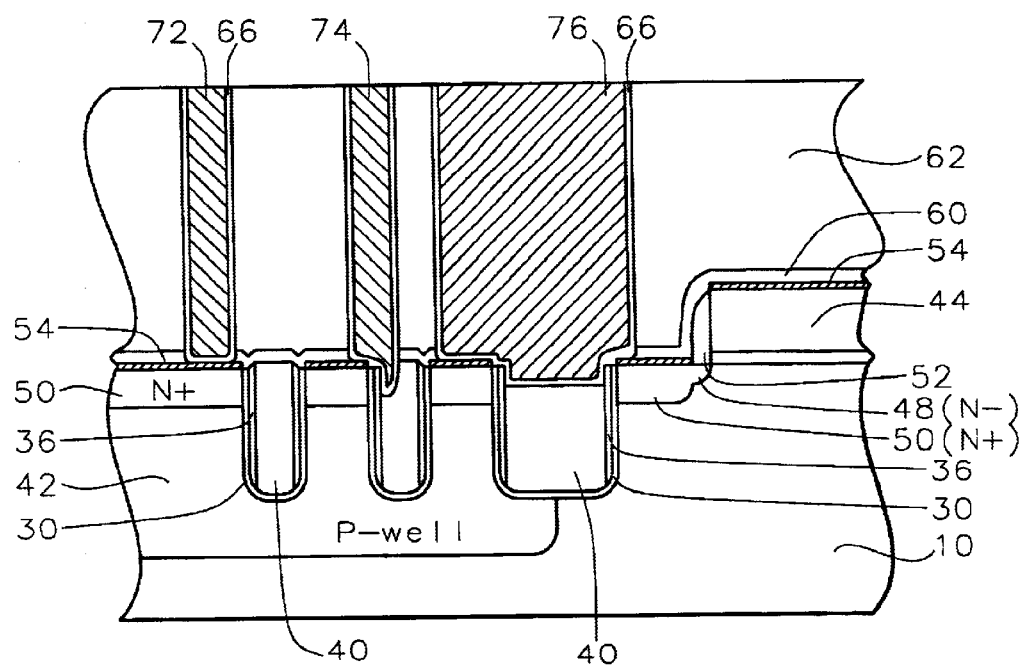
FIG. 16 is a cross-sectional representation of a local interconnect in a preferred embodiment of the present invention.

Referring now to FIG. 16, the etch stop liner sidewalls of the present invention prevent junction leakage also in the local interconnection process. In forming the contact openings, the dielectric layer 62 is etched away where it is not covered by a mask, not shown, to form contact openings with an etch stop at the conformal silicon nitride layer 60. Since the liner etch stop sidewalls 36 are so thin, they are not attacked significantly by this etching.

Processing now continues as is conventional in the art to complete the contacts. For example, a diffusion barrier layer, such as titanium/titanium nitride 66 is deposited conformally within the contact openings. Then the contact openings are filled with, for example, CVD tungsten, to form tungsten plugs 72, 74, and 76, where 76 is the local interconnect. Further metallization may be performed. The etch stop liner sidewalls 36 of the present invention act as an etch stop to prevent junction leakage in the case of misalignment as is 74 and 76 and also act as a diffusion barrier for the barrier layer 66.

Major yield loss because of junction leakage has been correlated with local interconnect etching. The process of the present invention prevents junction leakage in both non-local and local interconnect schemes. The process of the present invention reduces border-less contact leakage current to the substrate at the STI edge by forming a silicon nitride or silicon oxynitride etch stop liner on the sidewalls of the STI trenches.

While the invention has been particularly shown and described with reference to the preferred embodiments thereof, it will be understood by those skilled in the art that various changes in form and details may be made without departing from the spirit and scope of the invention.

What is claimed is:

1. A method of fabricating an integrated circuit device comprising:
    etching trenches into a semiconductor substrate; depositing an etch stop liner layer within said trenches;
    etching back said etch stop liner layer to leave said etch stop liner layer only on sidewalls of said trenches to form liner sidewalls;
    filling said trenches with an isolation layer overlying said liner sidewalls and polishing back said isolation layer wherein said isolation layer remains only within said trenches to complete formation of shallow trench isolation trenches separating active areas of said semiconductor substrate;
    forming semiconductor device structures in said active areas wherein said semiconductor device structures include source and drain junctions;
    depositing an interlevel dielectric layer over said semiconductor device structures; etching border-less contact openings through said interlevel dielectric layer wherein said liner sidewalls act as an etch stop during said etching thereby preventing leakage of said source and drain junctions; and
    filling said contact openings with a conducting layer wherein said liner sidewalls act as a diffusion barrier to said conducting layer to form interconnects to complete fabrication of said integrated circuit device.

2. The method according to claim 1 further comprising:
    forming a hard mask film stack overlying said semiconductor substrate;
    patterning said hard mask film stack to form openings where said trenches are to be formed; and
    thereafter etching into said semiconductor substrate underlying said openings to form said trenches.

3. The method according to claim 2 wherein said step of forming said hard mask film stack comprises:
    growing a pad oxide layer overlying said semiconductor substrate;
    depositing a silicon nitride layer overlying said pad oxide layer;
    depositing a second oxide layer overlying said silicon nitride layer; and
    depositing an anti-reflective coating layer overlying said second oxide layer.

4. The method according to claim 1 further comprising thermally oxidizing said semiconductor substrate to form an oxide liner layer within said trenches prior to said step of depositing said etch stop liner layer within said trenches.

5. The method according to claim 1 wherein said etch stop layer liner layer is selected from the group consisting of: silicon nitride and silicon oxynitride and wherein said etch stop liner layer is deposited to a thickness of between about 50 and 300 Angstroms.

6. The method according to claim 1 further comprising siliciding said source and drain junctions before said step of etching said border-less contacts.

7. The method according to claim 1 further comprising depositing a barrier layer underlying said conducting layer wherein said liner sidewalls act as a diffusion barrier to said barrier layer.

8. The method according to claim 7 wherein said barrier layer comprises titanium/titanium nitride.

9. The method according to claim 1 wherein said conducting layer comprises tungsten.

10. The method according to claim 1 wherein said interconnects are local interconnects.

11. The method according to claim 1 wherein said interconnects are non-local interconnects.

12. A method of fabricating an integrated circuit device comprising:
    forming a hard mask film stack overlying a semiconductor substrate;
    patterning said hard mask film stack to leave openings where shallow trench isolation regions are to be formed;
    etching trenches within said openings into said semiconductor substrate;
    thermally oxidizing said semiconductor substrate to form an oxide liner layer within said trenches;
    depositing an etch stop liner layer overlying said hard mask film stack and overlying said oxide liner layer within said trenches;
    etching back said etch stop liner layer to leave said etch stop liner layer only on sidewalls of said trenches to form liner sidewalls;
    filling said trenches with an isolation layer overlying said liner sidewalls and polishing back said isolation layer wherein said isolation layer remains only within said trenches to complete formation of said shallow trench isolation regions separating active areas of said semiconductor substrate;
    forming semiconductor device structures in said active areas wherein said semiconductor device structures include source and drain junctions;
    depositing an interlevel dielectric layer over said semiconductor device structures;
    etching border-less contact openings through said interlevel dielectric layer wherein said liner sidewalls act as an etch stop during said etching thereby preventing leakage of said source and drain junctions; and
    filling said contact openings with a conducting layer wherein said liner sidewalls act as a diffusion barrier to said conducting layer to form interconnects to complete fabrication of said integrated circuit device.

13. The method according to claim 12 wherein said step of forming said hard mask film stack comprises:
    growing a pad oxide layer overlying said semiconductor substrate;
    depositing a silicon nitride layer overlying said pad oxide layer;

depositing a second oxide layer overlying said silicon nitride layer; and depositing an anti-reflective coating layer overlying said second oxide layer.

14. The method according to claim 12 wherein said etch stop layer liner layer is selected from the group consisting of: silicon nitride and silicon oxynitride and wherein said etch stop liner layer is deposited to a thickness of between about 50 and 300 Angstroms.

15. The method according to claim 12 further comprising siliciding said source and drain junctions before said step of etching said border-less contacts.

16. The method according to claim 12 further comprising depositing a barrier layer underlying said conducting layer wherein said liner sidewalls act as a diffusion barrier to said barrier layer.

17. The method according to claim 16 wherein said barrier layer comprises titanium/titanium nitride.

18. The method according to claim 12 wherein said conducting layer comprises tungsten.

19. The method according to claim 12 wherein said interconnects are local interconnects.

20. The method according to claim 12 wherein said interconnects are non-local interconnects.

21. A method of fabricating an integrated circuit device comprising:

forming a hard mask film stack overlying a semiconductor substrate;

patterning said hard mask film stack to leave openings where shallow trench isolation regions are to be formed;

etching trenches within said openings into said semiconductor substrate;

thermally oxidizing said semiconductor substrate to form an oxide liner layer within said trenches;

depositing an etch stop liner layer overlying said hard mask film stack and overlying said oxide liner layer within said trenches;

etching back said etch stop liner layer to leave said etch stop liner layer only on sidewalls of said trenches to form liner sidewalls;

filling said trenches with an isolation layer overlying said liner sidewalls and polishing back said isolation layer wherein said isolation layer remains only within said trenches to complete formation of said shallow trench isolation regions separating active areas of said semiconductor substrate;

forming semiconductor device structures in said active areas wherein said semiconductor device structures include source and drain junctions;

depositing an interlevel dielectric layer over said semiconductor device structures;

etching border-less contact openings through said interlevel dielectric layer wherein said liner sidewalls act as an etch stop during said etching thereby preventing leakage of said source and drain junctions;

conformally depositing a barrier layer within said contact openings wherein said liner sidewalls act as a diffusion barrier to said barrier layer; and filling said contact openings with a conducting layer to form interconnects to complete fabrication of said integrated circuit device.

22. The method according to claim 21 wherein said step of forming said hard mask film stack comprises:

growing a pad oxide layer overlying said semiconductor substrate;

depositing a silicon nitride layer overlying said pad oxide layer;

depositing a second oxide layer overlying said silicon nitride layer; and depositing an anti-reflective coating layer overlying said second oxide layer.

23. The method according to claim 21 wherein said etch stop layer liner layer is selected from the group consisting of: silicon nitride and silicon oxynitride and wherein said etch stop liner layer is deposited to a thickness of between about 50 and 300 Angstroms.

24. The method according to claim 21 further comprising siliciding said source and drain junctions before said step of etching said border-less contacts.

25. The method according to claim 21 wherein said barrier layer comprises titanium/titanium nitride.

26. The method according to claim 21 wherein said conducting layer comprises tungsten.

27. The method according to claim 21 wherein said interconnects are local interconnects.

28. The method according to claim 21 wherein said interconnects are non-local interconnects.

* * * * *